(12) United States Patent
Ueda et al.

(10) Patent No.: US 10,361,266 B2
(45) Date of Patent: Jul. 23, 2019

(54) SEMICONDUCTOR DEVICE

(71) Applicant: Panasonic Intellectual Property Management Co., Ltd., Osaka (JP)

(72) Inventors: Yuki Ueda, Osaka (JP); Masao Uchida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 67 days.

(21) Appl. No.: 14/726,635

(22) Filed: Jun. 1, 2015

(65) Prior Publication Data

US 2015/0357405 A1    Dec. 10, 2015

(30) Foreign Application Priority Data

Jun. 9, 2014    (JP) ................. 2014-118519

(51) Int. Cl.
| | |
|---|---|
| H01L 29/06 | (2006.01) |
| H01L 29/78 | (2006.01) |
| H01L 29/739 | (2006.01) |
| H01L 29/66 | (2006.01) |
| H01L 29/861 | (2006.01) |

(Continued)

(52) U.S. Cl.
CPC .... *H01L 29/0619* (2013.01); *H01L 29/66712* (2013.01); *H01L 29/7395* (2013.01); *H01L 29/7802* (2013.01); *H01L 29/7811* (2013.01); *H01L 29/8611* (2013.01); *H01L 29/872* (2013.01); *H01L 29/1608* (2013.01)

(58) Field of Classification Search
CPC ............. H01L 29/0619; H01L 29/7811; H01L 29/66712
See application file for complete search history.

(56) References Cited

U.S. PATENT DOCUMENTS

| | | |
|---|---|---|
| 2005/0212053 A1 | 9/2005 | Miura et al. |
| 2009/0090968 A1 | 4/2009 | Ono et al. |

(Continued)

FOREIGN PATENT DOCUMENTS

| | | |
|---|---|---|
| JP | 62-291121 A | 12/1987 |
| JP | 10-308510 | 11/1998 |

(Continued)

*Primary Examiner* — Samuel A Gebremariam
*Assistant Examiner* — Jonas T Beardsley
(74) *Attorney, Agent, or Firm* — McDermott Will & Emery LLP

(57) ABSTRACT

A semiconductor device comprises a semiconductor substrate, a silicon carbide semiconductor layer of a first conductivity type on the semiconductor substrate, at least one ring-shaped region of a second conductivity type in the silicon carbide semiconductor layer, a first insulating film in contact with a part of the silicon carbide semiconductor layer, and a second insulating film which has a relative dielectric constant larger than a relative dielectric constant of the first insulating film and which is in contact with a part of the at least one ring-shaped region. In the semiconductor device, the at least one ring-shaped region is located in a termination region. The termination region surrounds a semiconductor element region when viewed from the direction perpendicular to a principal surface of the semiconductor substrate.

14 Claims, 10 Drawing Sheets

(51) Int. Cl.
*H01L 29/872* (2006.01)
*H01L 29/16* (2006.01)

(56) References Cited

U.S. PATENT DOCUMENTS

| | | | | |
|---|---|---|---|---|
| 2010/0025820 A1* | 2/2010 | Suekawa | H01L 29/0619 | 257/584 |
| 2011/0220917 A1* | 9/2011 | Hayashi | H01L 21/045 | 257/77 |
| 2012/0228636 A1* | 9/2012 | Maeyama | H01L 29/0619 | 257/77 |
| 2013/0313576 A1* | 11/2013 | Nakano | H01L 29/8611 | 257/77 |
| 2015/0333168 A1* | 11/2015 | Hirler | H01L 29/0615 | 257/329 |
| 2015/0380503 A1* | 12/2015 | Nakano | H01L 29/407 | 257/77 |

FOREIGN PATENT DOCUMENTS

| | | |
|---|---|---|
| JP | 2005-286023 | 10/2005 |
| JP | 2009-088345 A | 4/2009 |
| JP | 2010-050147 | 3/2010 |
| JP | 2012-146832 | 8/2012 |
| JP | 2013-062518 | 4/2013 |
| WO | 2011/027523 | 3/2011 |
| WO | 2012/105611 | 8/2012 |

* cited by examiner

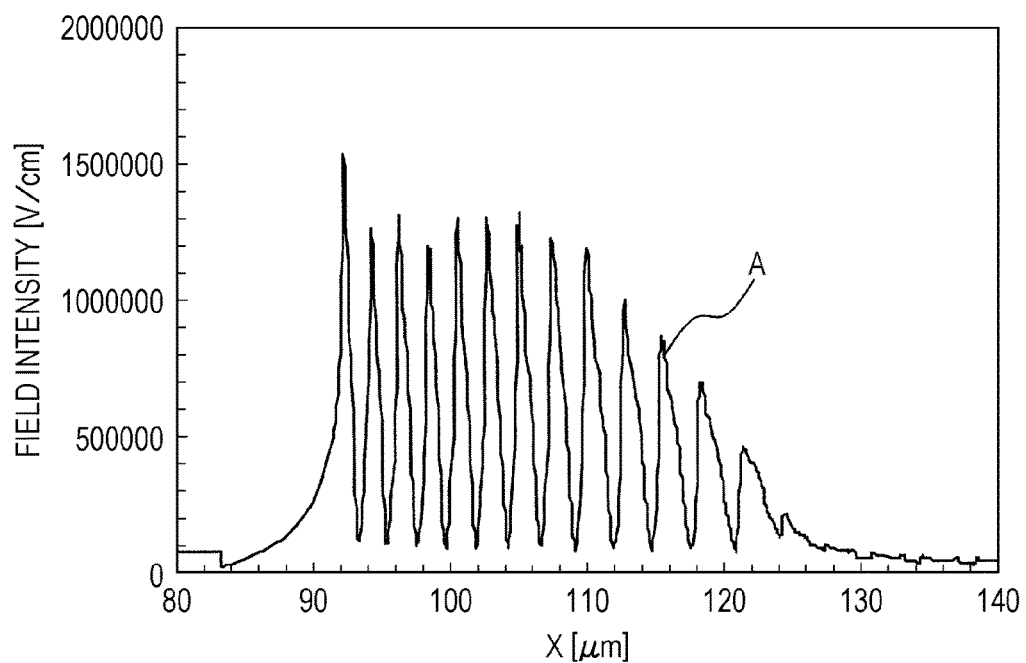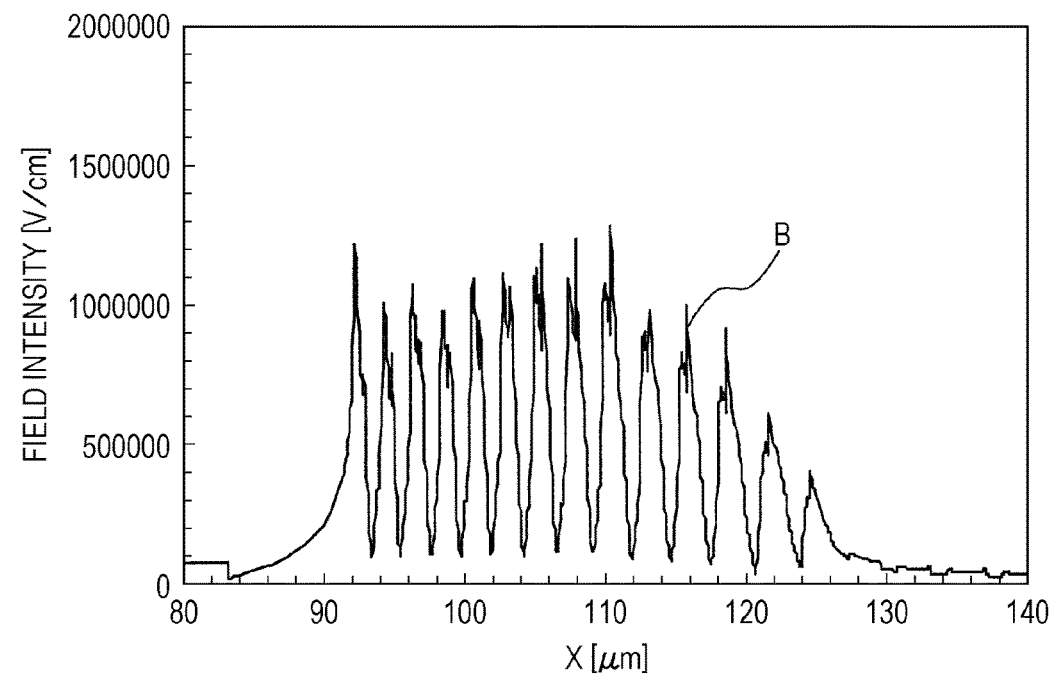

SEMICONDUCTOR DEVICE

BACKGROUND

1. Technical Field

The present disclosure relates to a semiconductor device by using silicon carbide.

2. Description of the Related Art

Power semiconductor devices are semiconductor elements used for applications in which withstand voltages are high and large currents are passed and it is desired that the loss be low. Power semiconductor devices including silicon (Si) substrates have been mainstream previously. However, in recent years, power semiconductor devices including silicon carbide (SiC) substrates have been noted and developed.

Silicon carbide (SiC) has a feature that the withstand voltage can be maintained even when a depletion layer in a pn junction portion or Schottky junction portion is made thin because the dielectric breakdown voltage of the material in itself is one digit higher than the dielectric breakdown voltage of silicon (Si). Consequently, in the case where SiC is used, the thickness of the device can be reduced and the doping concentration can be increased, so that SiC is expected as a material for forming a power semiconductor device with low on resistance, a high withstand voltage, and a low loss.

In general, a semiconductor device by using SiC is provided with a termination structure to ensure a withstand voltage in an off state. In general, the termination structure is disposed in a peripheral portion of the semiconductor device. As for the termination structure, a field limited ring (FLR) structure, a junction termination extension (JTE) structure, a mesa structure, or the like is used widely. The FLR structure and the JTE structure have a region which is disposed in the peripheral portion of the semiconductor device and which has been implanted with impurity ions. On the other hand, the mesa structure is formed from a height difference disposed in the peripheral portion of the semiconductor device. In the mesa structure as well, a region implanted with impurity ions may be disposed in the vicinity of the height difference.

The field intensity in the element of a power semiconductor device by using SiC is about 10 times larger than the field intensity in the element of a power semiconductor device by using Si. Consequently, the field intensity in the element peripheral portion of the power semiconductor device by using SiC is still larger than that of the power semiconductor device by using Si.

As shown in FIG. 12, Japanese Unexamined Patent Application Publication No. 2013-62518 proposes a structure provided with a plurality of concentric floating guard rings 220 arranged at some intervals in a silicon carbide layer 203, surface charge compensation regions 222 adjacent to the surface of the above-described silicon carbide layer 203 between the floating guard rings 220, a silicon nitride layer 210 on the silicon carbide layer 203, and an organic protective layer 214 on the silicon nitride layer 210. According to this structure, part of the surface charge compensation region 222 is depleted by a positive charge present at the interface between the silicon nitride layer 210 and the silicon carbide layer 203 and, thereby, a depletion region is formed in the surface charge compensation region 222. A negative charge in the depletion region in the surface charge compensation region 222 terminates the line of electric force generated from a positive charge present at this interface. As a result, an influence exerted on the device shown in FIG. 12 by the surface charge of the semiconductor can be reduced.

Also, as shown in FIG. 13, Japanese Patent No. 4796665 discloses a structure provided with an insulating film 308 made from silicon oxide, an interlayer insulating film 310 having a relative dielectric constant of 20 or more, a first protective insulating layer 314 disposed on the interlayer insulating film 310, and a second protective insulating layer 315 disposed on the first protective insulating layer 314 on the principal surface of a guard ring region 318 of a silicon carbide layer 303. In this structure, the linear expansion coefficient of a material constituting the first protective insulating layer 314 takes on a value between the linear expansion coefficient of a material constituting the second protective insulating layer 315 and the linear expansion coefficient of a material constituting the interlayer insulating film 310. According to this structure, the interlayer insulating film 310 having a high relative dielectric constant is present on the guard ring region 318 and, thereby, electric field concentration on the surface of the guard ring region 318 can be relaxed. In addition, generation of stress or strain resulting from a difference in thermal expansion coefficient between the interlayer insulating film 310 and the second protective insulating layer 315 can be suppressed by the first protective insulating layer 314.

SUMMARY

In one general aspect, the techniques disclosed here feature a semiconductor device comprising: a semiconductor substrate including a principal surface; a silicon carbide semiconductor layer of a first conductivity type that is located on the principal surface of the semiconductor substrate; at least one ring-shaped region of a second conductivity type that is arranged in the silicon carbide semiconductor layer; a first insulating film being in contact with a part of the silicon carbide semiconductor layer; and a second insulating film which has a relative dielectric constant larger than a relative dielectric constant of the first insulating film and which is in contact with a part of the at least one ring-shaped region, wherein: a region in which a part of the semiconductor substrate and a part of the silicon carbide semiconductor layer are located is defined as a semiconductor element region; a region in which another part of the semiconductor substrate and another part of the silicon carbide semiconductor layer are located, and by which the semiconductor element region is surrounded when viewed from a direction perpendicular to the principal surface of the semiconductor substrate is defined as a termination region; the at least one ring-shaped region is located in the termination region; the first insulating film is in contact with the part of the silicon carbide semiconductor layer in the termination region; and the second insulating film is in contact with the part of the at least one ring-shaped region in the termination region.

A semiconductor device according to an aspect of the present disclosure may realize an improvement in the reliability and an enhancement of the withstand voltage.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 is a diagram showing the field intensity in a region from 80 μm to 140 μm, on a horizontal axis basis, of the structure shown in FIG. 3A;

FIG. 5 is a diagram showing the field intensity in a region from 80 μm to 140 μm, on a horizontal axis basis, of the structure shown in FIG. 3B;

DETAILED DESCRIPTION

Figure 1A:
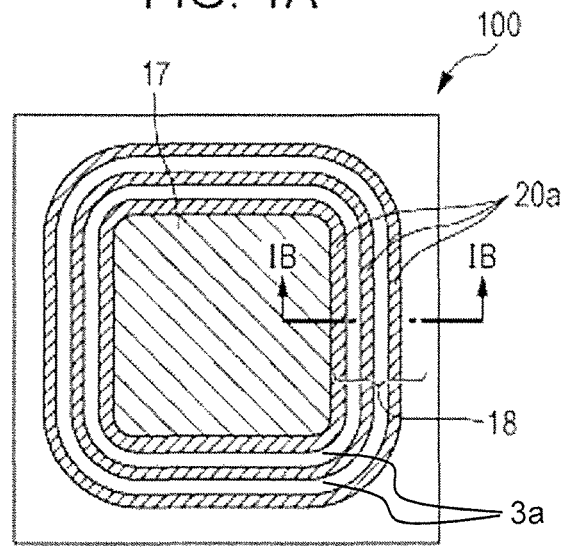
FIG. 1A is a plan view schematically showing a first embodiment of a semiconductor device according to the present disclosure.

As for the above-described semiconductor devices in the related art, further improvement in the reliability and enhancement of the withstand voltage have been desired.

The present inventor conducted studies in detail on the semiconductor devices disclosed in Japanese Unexamined Patent Application Publication No. 2013-62518 and Japanese Patent No. 4796665. According to the studies by the present inventor, it was found that in the semiconductor device disclosed in Japanese Unexamined Patent Application Publication No. 2013-62518, the silicon nitride layer 210 and the silicon carbide layer 203 were in contact with each other in the entire termination region and there was a possibility of generation of stress and strain resulting from a difference in thermal expansion coefficient between the materials. There is also a possibility of an occurrence of cracking in the organic protective layer 214 or the like because of such stress and strain. Japanese Unexamined Patent Application Publication No. 2013-62518 also proposes a structure provided with a silicon oxide layer between the silicon carbide layer 203 and the silicon nitride layer 210. In this structure, the relative dielectric constant of silicon oxide is lower than the relative dielectric constant of silicon carbide and, therefore, high field intensity is applied in the silicon oxide layer, so that degradation in moisture resistance reliability due to a high electric field may occur.

In the semiconductor device disclosed in Japanese Patent No. 4796665, the electric field is concentrated on the insulating film 308 made from silicon oxide and located between the silicon carbide layer 303 and the interlayer insulating film 310, so that degradation in moisture resistance reliability may occur because of a high electric field.

The present inventor has devised a new semiconductor device, wherein a predetermined withstand voltage can be ensured by reducing the field intensity in an insulating film while the stress between materials used for the semiconductor device is suppressed. The outline of the semiconductor device according to the present disclosure is as described below.

The semiconductor device according to the present disclosure comprising: a semiconductor substrate including a principal surface; a silicon carbide semiconductor layer of a first conductivity type that is located on the principal surface of the semiconductor substrate; at least one ring-shaped region of a second conductivity type that is arranged in the silicon carbide semiconductor layer; a first insulating film being in contact with a part of the silicon carbide semiconductor layer; and a second insulating film which has a relative dielectric constant larger than a relative dielectric constant of the first insulating film and which is in contact with a part of the at least one ring-shaped region, wherein: a region in which a part of the semiconductor substrate and a part of the silicon carbide semiconductor layer are located is defined as a semiconductor element region; a region in which another part of the semiconductor substrate and another part of the silicon carbide semiconductor layer are located, and by which the semiconductor element region is surrounded when viewed from a direction perpendicular to the principal surface of the semiconductor substrate is defined as a termination region; the at least one ring-shaped region is located in the termination region; the first insulating film is in contact with the part of the silicon carbide semiconductor layer in the termination region; and the second insulating film is in contact with the part of the at least one ring-shaped region in the termination region.

The above-described second insulating film may include a portion located on the first insulating film and another portion in contact with the silicon carbide semiconductor layer in the termination region.

The at least one ring-shaped region may comprise a plurality of ring-shaped regions and the second insulating film may be in contact with a part of the ring-shaped region arranged nearest to the semiconductor element region among the plurality of ring-shaped regions.

The second insulating film may be in contact with a boundary, which is farther from the semiconductor element region, of two boundaries between the ring-shaped region and the silicon carbide semiconductor layer in a cross-section perpendicular to the principal surface of the semiconductor substrate.

The at least one ring-shaped region may comprise a plurality of ring-shaped regions, and the second insulating film may be in contact with a boundary, which is farther from the semiconductor element region, of two boundaries between each of the plurality of ring-shaped regions and the silicon carbide semiconductor layer in a cross-section perpendicular to the principal surface of the semiconductor substrate.

The second insulating film may be formed from an insulating material containing silicon nitride.

The first insulating film may be formed from an insulating material containing silicon oxide.

The at least one ring-shaped region may comprise a plurality of ring-shaped regions, and the plurality of ring-shaped regions may constitute a field limited ring structure.

The semiconductor device may further comprise a diode located in the semiconductor element region.

The semiconductor device may further comprise a field-effect transistor located in the semiconductor element region. In the semiconductor device according to an aspect of the present disclosure, the second insulating film having a relative dielectric constant larger than the relative dielectric constant of the first insulating film is in contact with the ring region. Therefore, electric field concentration on the insulating film in contact with the silicon carbide semiconductor layer surface in the termination region may be relaxed. As a result, the moisture resistance reliability may be improved and a predetermined withstand voltage may be obtained. The contact surface between the second insulating film and the silicon carbide layer is limited to part of the termination region and, thereby, cracking in the insulating film and degradation in reliability in association with the stress resulting from a difference in thermal expansion coefficient between the silicon carbide semiconductor layer and the second insulating film may be suppressed.

The embodiments of the semiconductor device according to the present disclosure will be described below with reference to the drawings. In the following embodiments, an example in which the first conductivity type is an n-type and the second conductivity type is a p-type is explained. In this regard, the first conductivity type may be a p-type and the second conductivity type may be an n-type. In the following drawings, for the sake of simplifying explanations, constituents having substantially the same function are indicated by the same reference numeral. The present disclosure is not limited to the following embodiments.

First Embodiment

Figure 1B:
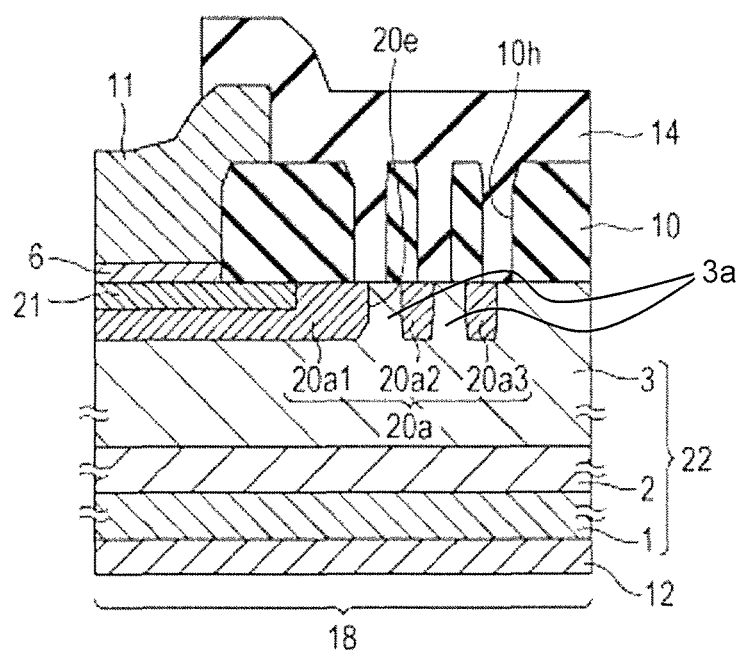
FIG. 1B is a sectional view schematically showing a termination region of the first embodiment of a semiconductor device according to the present disclosure.

FIG. 1A is a diagram showing a planar arrangement of a semiconductor element region and a termination region in an entire semiconductor device 100. FIG. 1B is a sectional view schematically showing the semiconductor device 100 according to a first embodiment of the present disclosure. FIG. 1B is a sectional view of the section taken along a line IB-IB shown in FIG. 1A.

As shown in FIG. 1A and FIG. 1B, the semiconductor device 100 according to the present embodiment is provided with a stacked structure 22 including a silicon carbide substrate 1 serving as a semiconductor substrate and a drift layer 3 serving as a silicon carbide semiconductor layer. In the present embodiment, the stacked structure 22 further includes a silicon carbide buffer layer 2 between the silicon carbide substrate 1 and the drift layer 3. However, in the stacked structure of the semiconductor device according to the present embodiment, the silicon carbide buffer layer 2 is not necessarily disposed. The semiconductor device 100 is provided with a semiconductor element region 17 which includes part of the silicon carbide substrate 1, part of the silicon carbide buffer layer 2, and part of the drift layer 3 and which has an element function and a termination region 18 which includes another part of the silicon carbide substrate 1, another part of the silicon carbide buffer layer 2, and another part of the drift layer 3. The semiconductor element region 17 has an element function of, for example, switching in the case where the semiconductor element arranged in the semiconductor element region 17 is a transistor and, for example, rectifying in the case where the semiconductor element is a diode. The termination region 18 surrounds the semiconductor element region 17 when viewed from the direction perpendicular to the principal surface of the silicon carbide substrate 1.

The semiconductor device 100 includes a termination structure 20, which is located in the drift layer 3 and which surrounds the semiconductor element region 17 when viewed from the direction perpendicular to the principal surface of the silicon carbide substrate 1, in the termination region 18. Specifically, the termination structure 20 includes a plurality of p-type ring-shaped regions 20a1, 20a2, and 20a3 each surrounding the semiconductor element region 17. Hereafter these three ring-shaped regions are collectively referred to as a ring-shaped region 20a. The ring-shaped region 20a has a plurality of p-type regions which have the shape of a ring and which are located at a distance from each other. The plurality of p-type regions constitute the FLR structure. Each p-type region has a substantially tetragonal shape in a plan view, where four corners are rounded into the shape of an arc. The four corners of the p-type region are rounded into the shape of an arc and, thereby, electric field concentration on the four corners of the p-type region is suppressed. The n-type impurity concentration of the silicon carbide substrate 1 is, for example, $8 \times 10^{18}$ cm$^{-3}$, the n-type impurity concentration of the silicon carbide buffer layer 2 is, for example, about $1 \times 10^{18}$ cm$^{-3}$, the thickness of the silicon carbide buffer layer 2 is, for example, 0.5 μm, the n-type impurity concentration of the drift layer 3 is, for example, about $8 \times 10^{15}$ cm$^{-3}$, and the thickness of the drift layer 3 is, for example, 11 μm.

In the inside of the ring-shaped region 20a1, a contact region 21 having a p-type impurity concentration higher than the p-type impurity concentration of the ring-shaped region 20a is disposed. The p-type impurity concentration of the ring-shaped region 20a is, for example, $2 \times 10^{19}$ cm$^{-3}$ and the p-type impurity concentration of the contact region 21 is, for example, $2 \times 10^{20}$ cm$^{-3}$. The ring-shaped region 20a and the contact region 21 are formed by performing ion implantation of aluminum (Al) ions or boron (B) ions into the drift layer 3. The contact region 21 is covered with a contact electrode 6 made from, for example, nickel silicide. A source electrode 11 is disposed on the contact electrode 6 and a drain electrode 12 is disposed on the back of the silicon carbide substrate 1.

In the present embodiment, the contact region 21, the contact electrode 6, and the source electrode 11 are disposed in the ring-shaped region 20a1, which is nearest to the semiconductor element region 17, among the ring-shaped regions. Consequently, the ring-shaped region 20a1 constitutes a pn junction diode together with the contact region 21, the contact electrode 6, the source electrode 11, the drift layer 3, and the drain electrode 12. In the present disclosure, the ring-shaped region 20a1 constituting the pn junction diode is also included in the termination structure 20.

A first insulating film 10 made from, for example, silicon oxide is disposed on the drift layer 3 including ring-shaped regions 3a and the termination structure 20 in the termination region 18. A second insulating film 14 having a relative dielectric constant higher than the relative dielectric constant of the first insulating film 10 is disposed on the first insulating film 10 and the source electrode 11. At this time, the second insulating film 14 is disposed in such a way as to come into contact with a portion where the field intensity is the highest in the surface of the termination region 18. For example, a silicon nitride film is used for the second insulating film 14.

Figure 2A:
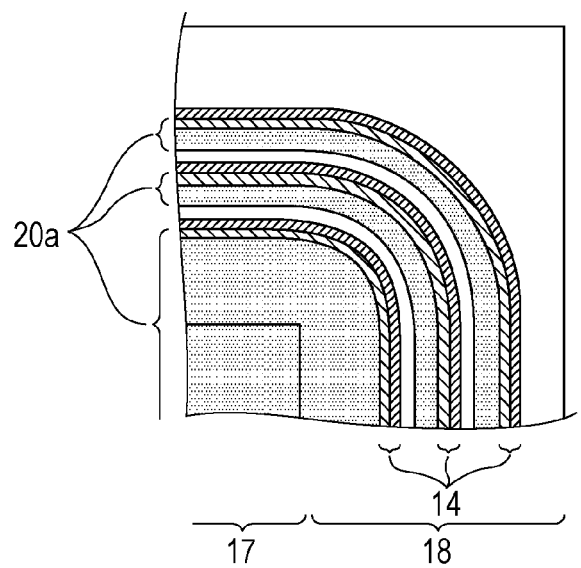
FIG. 2A is a schematic diagram of the termination region viewed from the surface in the first embodiment according to the present disclosure.
Figure 2B:
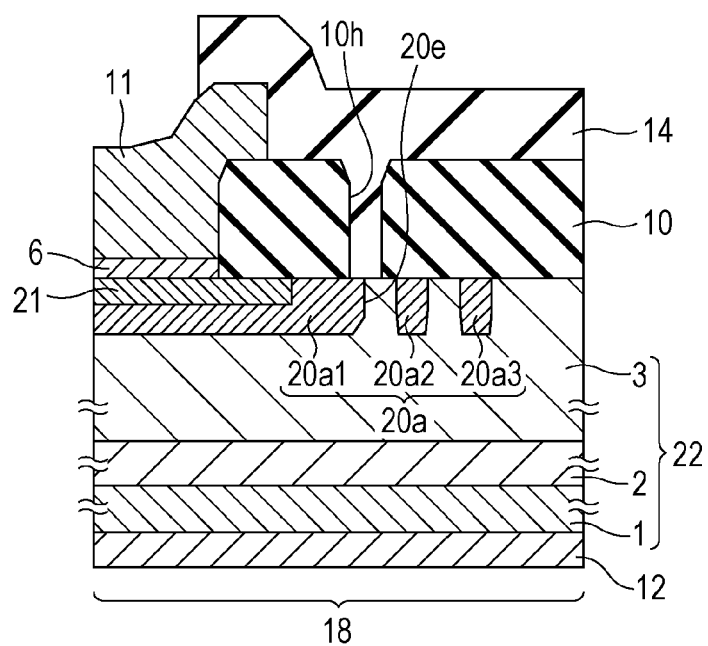
FIG. 2B is a diagram showing a modified example of the first embodiment.

More specifically, in the termination region 18, the second insulating film 14 includes portions located on the first insulating film 10 and portions in contact with the drift layer 3. The second insulating film 14 is in contact with the ring-shaped region 20a and the drift layer 3 in such a way as to come into contact with the boundary between the ring-shaped region 20a and the drift layer 3. For example, in the case where the electric field is the highest at the boundary between the ring-shaped region 20a1, which is nearest to the semiconductor element region 17 among the ring-shaped regions, and the drift layer 3, the second insulating film 14 is in contact with at least part of the ring-shaped region 20a1. As shown in FIG. 2B, in a cross-section perpendicular to the principal surface of the silicon carbide substrate 1, the second insulating film 14 is in contact with the ring-shaped region 20a1 and the drift layer 3 in such a way as to come into contact with a boundary 20e, which is farther from the semiconductor element region 17, of the boundaries between the ring-shaped region 20a1 and the drift layer 3. As shown in FIG. 1B, the second insulating film 14 may be in contact with each of the ring-shaped regions 20a1, 20a2, and 20a3 and the drift layer 3 in such a way as to come into contact with a boundary, which is farther from the semiconductor element region 17, of the boundaries between each of the ring-shaped regions 20a1, 20a2, and 20a3 and the drift layer 3.

The semiconductor device 100 according to the present embodiment may be produced following a common production procedure of the semiconductor device except formation of the first insulating film 10 and the second insulating film 14. After the first insulating film 10 is formed, as shown in FIG. 1B, a contact hole 10h to expose part of the ring-shaped region 20a is formed in the termination region 18 through etching by using a mask. Thereafter, the second insulating film 14 is formed on the first insulating film 10 and, thereby, the contact hole 10h is embedded with the second insulating film 14. Consequently, the second insulating film 14 is brought into contact with the drift layer 3 and the ring-shaped region 20a in the contact hole 10h.

Next, the results of studies on the electric field distribution and the withstand voltage in the termination region based on the technology computer aided design (TCAD) simulation will be described.

Figure 3A:
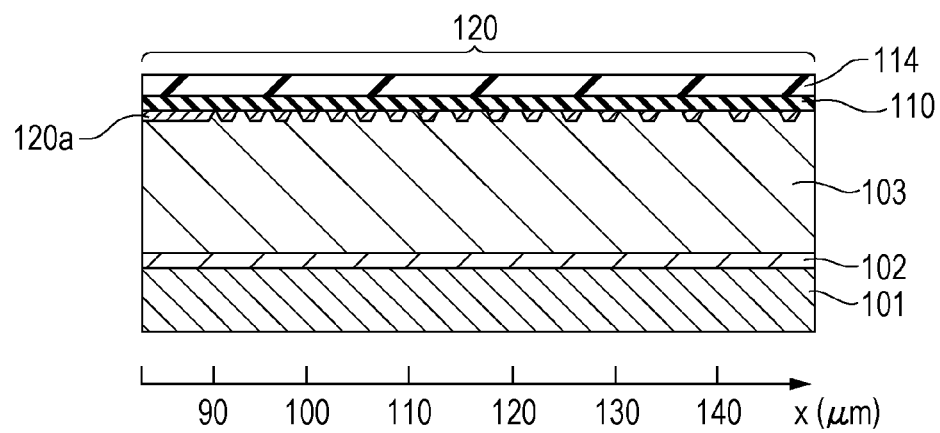
FIGS. 3A and 3B are sectional views schematically showing termination structures of 4H—SiC semiconductor models used for two-dimensional TCAD simulation.
Figure 3B:
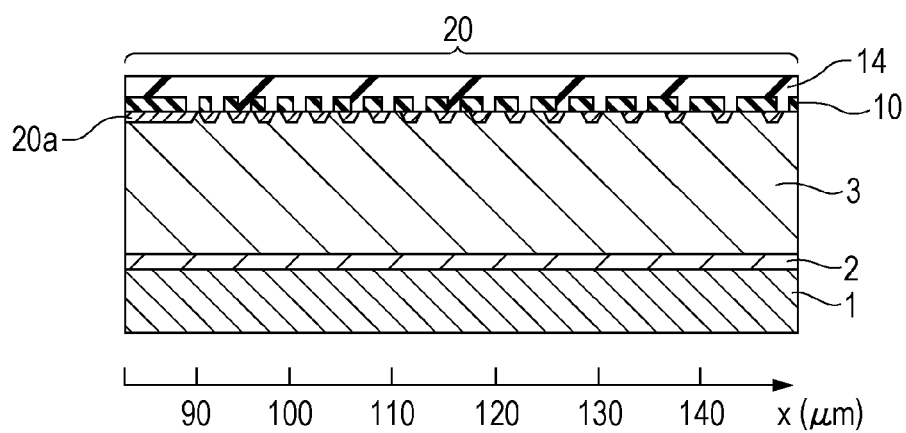

FIG. 3A and FIG. 3B are sectional views schematically showing termination structures of 4H—SiC semiconductor models used for two-dimensional TCAD simulation. FIG. 3A shows a structure model of a reference example provided with a termination structure 120, a first insulating film 110, and a second insulating film 114, where the second insulating film 114 is not in contact with the termination structure 120. In FIG. 3A, a second conductivity type ring-shaped region 120a is arranged in the drift layer 103 disposed on a silicon carbide substrate 101 with a silicon carbide buffer layer 102 therebetween. The second insulating film 114 having a relative dielectric constant higher than the relative dielectric constant of the first insulating film 110 is disposed on the first insulating film 110, and the second insulating film 114 and the termination structure 120 are separated by the first insulating film 110. Although not shown in the drawing, an opening is disposed in the first insulating film 110, a source electrode is disposed in the opening, and a drain electrode is disposed on the back of the silicon carbide substrate 101. A silicon oxide film (relative dielectric constant 3.9) having a thickness of 1.0 μm was used for the first insulating film 110, and silicon nitride film (relative dielectric constant 7.5) having a thickness of 1.6 μm was used for the second insulating film 114. The voltage between drain and source of the semiconductor element was specified to be 1,200 V.

FIG. 3B shows a structure model of an example provided with a termination structure 20, a first insulating film 10, and a second insulating film 14, where part of the second insulating film 14 is in contact with the termination structure 20. In FIG. 3B, each second conductivity type ring-shaped region 20a is in contact with the second insulating film 14, where the width of contact range is 1.0 μm. In FIG. 3B, the same constituents as those in FIGS. 1A and 1B are indicated by the same reference numerals and explanations thereof are not provided.

FIG. 4 is a diagram showing the graph of the field intensity in a region from 80 μm to 140 μm, on a horizontal axis basis, of the structure shown in FIG. 3A. FIG. 4 shows the field intensity A at the interface between the drift layer 103 and the first insulating film 110. FIG. 5 is a diagram showing the graph of the field intensity in a region from 80 μm to 140 μm, on a horizontal axis basis, of the structure shown in FIG. 3B. FIG. 5 shows the field intensity B at the interfaces between the drift layer 3 and the first insulating film 10 and between the drift layer 3 and the second insulating film 14.

According to a comparison between FIG. 4 and FIG. 5, the peak value of the curve A in FIG. 4 is about 1.532 (MV/cm), whereas the peak value of the curve B in FIG. 5 is about 1.277 (MV/cm). As described above, it was ascertained that the maximum field intensity in the termination structure of the semiconductor device according to the present example was able to be reduced by about 17% as compared with the maximum field intensity of the semiconductor device of the reference example.

In the reference example and the present example, design is made in such a way that the field intensity becomes the highest at each of the ring-shaped regions 120a and 20a nearest to the semiconductor element region 17 among each of the second conductivity type ring-shaped regions 120a and 20a in the termination structures 120 and 20, respectively. FIG. 4 shows that in the reference example, the field intensity of the surface of the drift layer 103, at which the ring-shaped region 120a nearest to the semiconductor element region 17 is located, is the highest. FIG. 5 shows that in the example, the field intensity of the surface of the drift layer 3, at which the ring-shaped region 20a nearest to the semiconductor element region 17 is located, is reduced as compared with the field intensity in the reference example.

The withstand voltage simulation of the termination region was performed by using the structure models shown in FIG. 3A and FIG. 3B. As a result, the withstand voltage of the structure of the reference example shown in FIG. 3A was about 1,391 V, and the withstand voltage of the structure of the example shown in FIG. 3B was about 1,668 V. It was able to be ascertained from these results that the withstand voltage of the termination region in the semiconductor device according to the present example was improved by about 20% as compared with the withstand voltage of the semiconductor device according to the reference example.

As is clear from the above-described results, according to the semiconductor device of the present embodiment, it is possible to improve the moisture resistance reliability of the semiconductor device and obtain a predetermined withstand voltage. In the termination region 18, the contact surface between the second insulating film 14 and the drift layer 3 is limited to part of the termination region and, thereby, cracking in the insulating film and degradation in reliability in association with the stress resulting from a difference in thermal expansion coefficient between the drift layer 3 and the second insulating film 14 can be suppressed.

The structure is not limited to the structure shown in FIG. 3B, and the same effects are obtained by the structure in which the second insulating film 14 is in contact with the termination region 18 at a place where the field intensity becomes a maximum on the surface of the termination region 18 (for example, arc-shaped portions at four corners in a plan view of the ring-shaped region 20a) because the maximum field intensity at the interfaces between the drift layer 3 and the first insulating film 10 and between the drift layer 3 and the second insulating film 14 can be reduced. Examples of places where the field intensity may become a maximum on the surface of the termination region 18 include arc-shaped portions at four corners of the ring-shaped region 20a when viewed from the direction perpendicular to the principal surface of the silicon carbide substrate 1.

In the present embodiment, the design is made in such a way that the field intensity becomes the highest in the ring-shaped region 20a1 nearest to the semiconductor element region 17 among the ring-shaped regions in the termination structure 20. However, the design of the field intensity distribution in the termination structure 20 is not limited to this example and the design may be made in such a way that the field intensity becomes a maximum in the ring-shaped region other than the ring-shaped region 20a1 nearest to the semiconductor element region 17. In this case, the second insulating film 14 is specified to be in contact with at least a ring-shaped region which is designed to exhibit the highest field intensity. Consequently, it becomes possible to reduce the field intensity as compared with the case where the ring-shaped region which is designed to exhibit the highest field intensity is in contact with the first insulating film 10 having a small relative dielectric constant.

In the present embodiment, the example in which the entire ring-shaped region 20a included in the termination structure 20 is in contact with the second insulating film 14 has been described. However, as described above, in the case where the second insulating film 14 is in contact with at least a ring-shaped region which is designed to exhibit the highest field intensity, the other ring-shaped regions are not necessarily in contact with the second insulating film 14. For example, as shown in FIG. 2B, in the case where the design is made in such a way that the field intensity becomes the highest in the ring-shaped region 20a1, which is nearest to the semiconductor element region 17, among the ring-shaped regions, the other ring-shaped regions 20a2 and 20a3 are not necessarily in contact with the second insulating film 14.

Second Embodiment

Figure 6A:
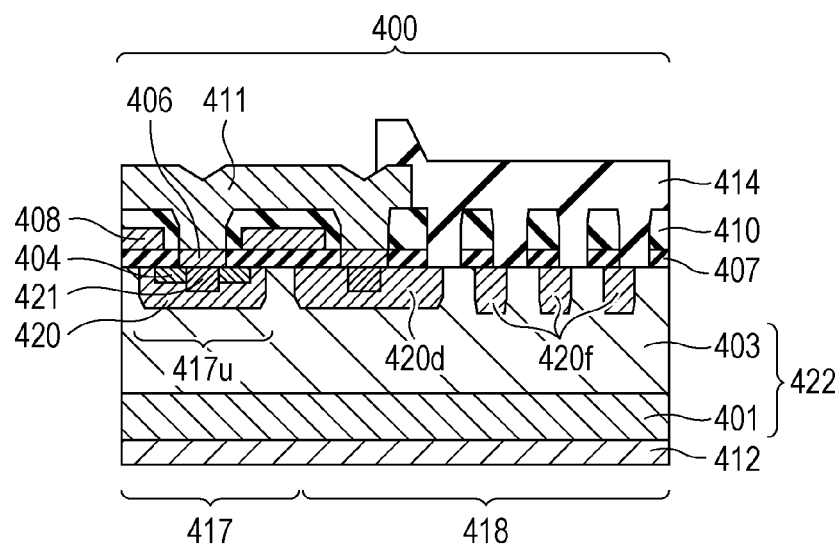
FIG. 6A is a sectional view schematically showing a second embodiment of a semiconductor device according to the present disclosure.
Figure 6B:
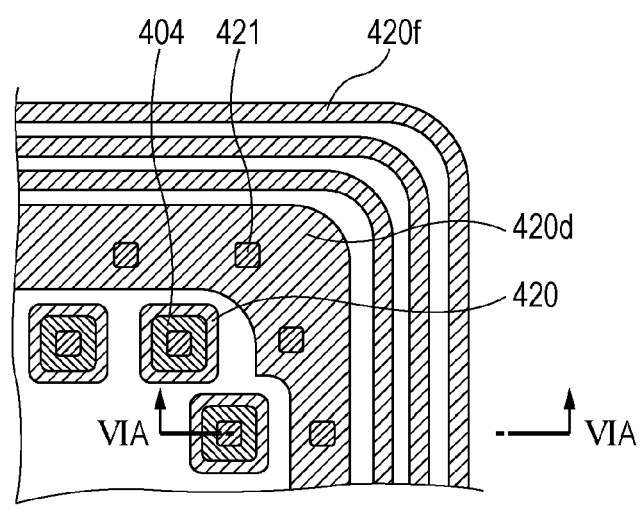
FIG. 6B is a plan view schematically showing the second embodiment of a semiconductor device according to the present disclosure.

A semiconductor device 400 according to a second embodiment of the present disclosure will be described below with reference to FIG. 6A to FIG. 10B. FIG. 6A is a sectional view schematically showing the semiconductor device 400 according to the present embodiment and FIG. 6B is a plan view schematically showing the semiconductor device 400 according to the present embodiment. FIG. 6A is a sectional view of the section taken along a line VIA-VIA shown in FIG. 6B.

The semiconductor device 400 according to the present embodiment includes a metal-insulator-semiconductor field-effect transistor (MISFET) as a semiconductor element in a semiconductor element region. Explanations of the same configurations as the configurations of the semiconductor device 100 according to the first embodiment will not be provided.

As shown in FIG. 6A and FIG. 6B, the semiconductor device 400 according to the present embodiment is provided with a stacked structure 422 including a silicon carbide substrate 401 serving as a semiconductor substrate and a drift layer 403 serving as a silicon carbide semiconductor layer. The semiconductor device 400 is provided with a transistor region 417 which is a semiconductor element region including part of the silicon carbide substrate 401 and part of the drift layer 403 and a termination region 418 including another part of the silicon carbide substrate 401 and another part of the drift layer 403. The termination region 418 surrounds the transistor region 417 when viewed from the direction perpendicular to the principal surface of the silicon carbide substrate 401. The termination region 418 includes a plurality of p-type ring-shaped regions 420d and 420f each surrounding the semiconductor region 417.

A gate insulating film 407 and an interlayer insulating film 410 are disposed on the drift layer 403 and ring-shaped regions 420d and 420f in the termination region 418. The gate insulating film 407 and the interlayer insulating film 410 correspond to the first insulating film according to the present disclosure. The gate insulating film 407 and the interlayer insulating film 410 are formed from, for example, silicon oxide. A passivation film 414 which is a second insulating film having a relative dielectric constant higher than the relative dielectric constant of the first insulating film is disposed on the interlayer insulating film 410. The passivation film 414 is made from, for example, silicon nitride.

A plurality of unit cells 417u are arranged in the transistor region 417. These unit cells 417u are connected in parallel. One unit cell 417u has, for example, a square shape when the semiconductor device 400 is viewed from the direction perpendicular to the principal surface of the silicon carbide substrate 401. The unit cell 417u may have a rectangular shape or a polygonal shape other than a tetragon or have the shape of a stripe extending in one direction.

Each unit cell 417u is provided with a second conductivity type body region 420 located in at least part of the surface of the drift layer 403, a first conductivity type source region 404 located in the body region 420, a gate insulating film 407 covering at least part of the body region 420, a gate electrode 408, a source electrode 406, and a drain electrode 412.

The gate insulating film 407 covers at least the body region 420 exposed at the surface of the drift layer 403 in each unit cell 417u. In this example, the gate insulating film 407 is in contact with the body region 420. A first conductivity type channel layer may be disposed between the body region 420 and the gate insulating film 407.

The gate electrode 408 is arranged on the body region 420 with the gate insulating film 407 therebetween.

The source electrode 406 is electrically connected to the source region 404. A second conductivity type contact region 421 having an impurity concentration higher than the impurity concentration of the body region 420 may be disposed in the body region 420. In the present embodiment, the source electrode 406 is arranged in such a way as to be brought into contact with both the source region 404 and the contact region 421 and is electrically connected to both the source region 404 and the contact region 421.

The drain electrode 412 is arranged on the back of the silicon carbide substrate 401.

In the present embodiment, the interlayer insulating film 410 is disposed in such a way as to cover the gate electrode 408 in the transistor region 417. An upper electrode 411 is disposed on the interlayer insulating film 410. The upper electrode 411 is electrically connected to the source electrode 406 in a contact hole disposed in the interlayer insulating film 410.

Next, a method for manufacturing the semiconductor device 400 according to the present embodiment will be described with reference to FIG. 7A to FIG. 10B. FIG. 7A to FIG. 10B are sectional views showing production steps of the semiconductor device 400 according to the present embodiment.

The silicon carbide substrate 401 is prepared. The silicon carbide substrate 401 is, for example, a low-resistance n-type 4H—SiC off cut substrate having a resistivity of about 0.02 Ωcm.

Figure 7A:
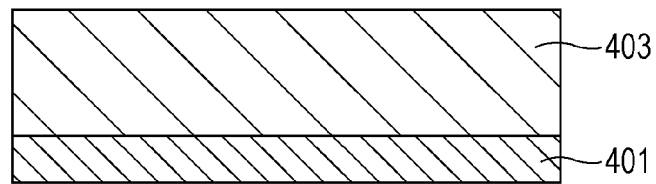
FIGS. 7A to 7D are sectional views showing production steps of the semiconductor device in the second embodiment of the semiconductor device according to the present disclosure.

As shown in FIG. 7A, the high-resistance n-type drift layer 403 is formed through epitaxial growth on the silicon carbide substrate 401. Before the drift layer 403 is formed, a buffer layer made from SiC having a high n-type impurity concentration may be deposited on the silicon carbide substrate 401. The impurity concentration of the buffer layer is, for example, $1\times10^{18}$ cm$^{-3}$, and the thickness of the buffer layer is, for example, 1 μm. The drift layer 403 is made from, for example, n-type 4H—SiC, and the impurity concentration and the film thickness are, for example, $1\times10^{16}$ cm$^{-3}$ and 10 μm, respectively.

Figure 7B:
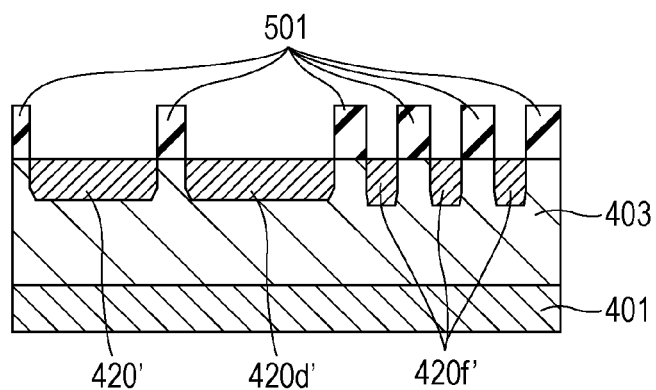

As shown in FIG. 7B, a mask 501 made from, for example, SiO$_2$ is formed on the drift layer 403 and, for example, aluminum (Al) ions are implanted into the drift layer 403. Consequently, a body implantation region 420' and ring implantation regions 420d' and 420f' are formed at the same time. For example, the concentration of implanted Al ions is about $2\times10^{17}$ cm$^{-3}$, and the ion implantation energy and the dosage are adjusted in such a way that the depth of implanted Al ion becomes about 0.5 to 1.0 μm. The depth here corresponds to the distance from the drift layer surface to the position at which the concentration of implanted Al ions becomes equal to the n-type impurity concentration of the drift layer. The depth profiles of the impurity concentration in the direction perpendicular to the principal surface of the silicon carbide substrate 401 of the body implantation region 420' and the ring implantation regions 420d' and 420f' are the same.

Figure 7C:
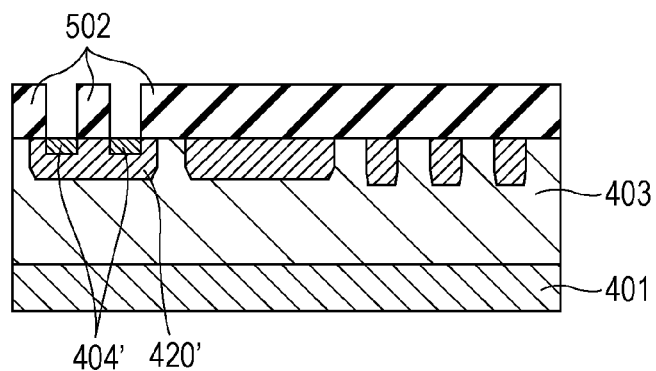

As shown in FIG. 7C, after the ion implantation, the mask 501 is removed and, subsequently, a source implantation region 404' is formed by using a mask 502 made from, for example, SiO$_2$ and ion-implanting, for example, nitrogen into the body implantation region 420' corresponding to the unit cell 417u. Alternatively, part of the mask 501 is left, SiO$_2$ or the like is further deposited, working is performed partly to form a mask on the side wall of the mask 501 and, thereby, a mask corresponding to the mask 502 may be formed. That is, a so-called self-aligning process may be applied, where the source implantation region 404' is formed in the body implantation region 420' in a self-aligned manner. The ion implantation profile is adjusted in such a way that the depth of the source implantation region 404' becomes, for example, 250 nm and the average impurity concentration becomes about $5\times10^{19}$ cm$^{-3}$.

Figure 7D:
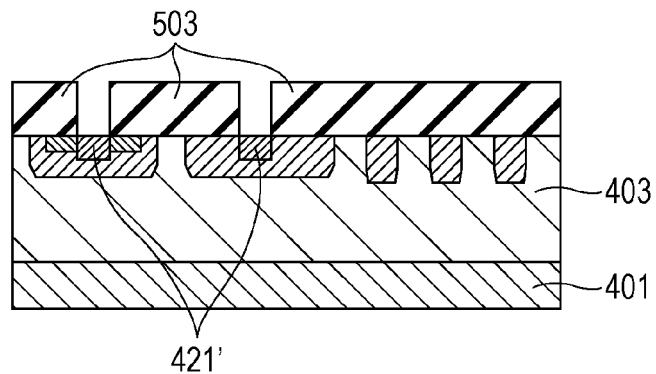

After the ion implantation, the mask 502 is removed. As shown in FIG. 7D, a mask 503 is formed and, thereafter, Al ions are implanted, so that contact implantation regions 421' are formed. The depth of the contact implantation region 421' is, for example, 400 nm and the average impurity concentration is about $1\times10^{20}$ cm$^{-3}$. The depth thereof is specified to be the depth at which the impurity concentration of, for example, $5\times10^{17}$ cm$^{-3}$ is obtained.

Figure 8A:
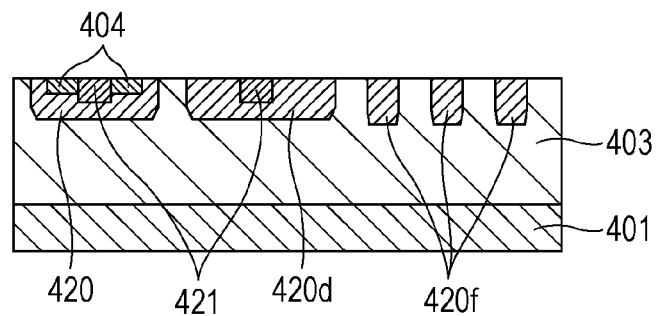
FIGS. 8A to 8D are sectional views showing production steps of the semiconductor device in the second embodiment of the semiconductor device according to the present disclosure.

The mask 503 is removed. After every ion implantation is performed, a high-temperature heat treatment (activation annealing) to activate the impurity implanted into the drift layer 403 is performed and, thereby, as shown in FIG. 8A, the body region 420, the ring-shaped regions 420d and 420f, the source region 404, and the contact regions 421 are formed. The activation annealing may be realized by, for example, depositing about 200 nm of carbon film on the drift layer 403, and performing a heat treatment at about 1,700° C. for about 30 minutes in an atmosphere of inert gas, e.g., Ar or N$_2$, or in a vacuum.

In this regard, for the purpose of cleaning the surface of the drift layer 403 after the activation annealing, the surface layer of the drift layer 403 may be removed. For example, in the case where the surface layer of the drift layer 403 is removed by 50 nm, all depths of the body region 420, the ring-shaped regions 420d and 420f, the source region 404, and the contact regions 421 are reduced by about 50 nm. For example, the surface of the drift layer 403 is removed by about 50 nm through a step to remove a thermal oxidation film after thermal oxidation (sacrificial oxidation step) and a step to form a gate oxide film described later.

The gate insulating film 407 is formed on the drift layer surface through surface removal on the basis of sacrificial oxidation and the thermal oxidation step thereafter. A polycrystalline silicon film doped with about $7\times10^{20}$ cm$^{-3}$ of phosphorus is deposited on the surface of the gate insulating film 407. The thickness of the polycrystalline silicon film is, for example, about 500 nm.

Figure 8B:
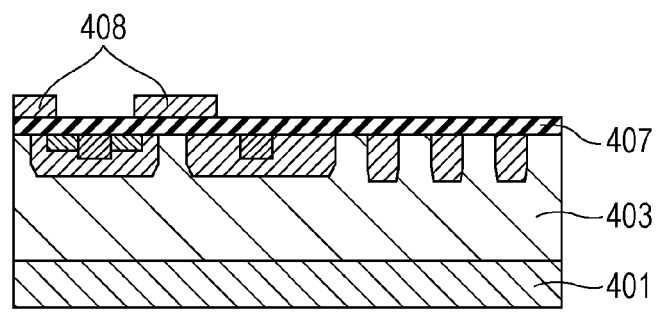
Figure 8C:
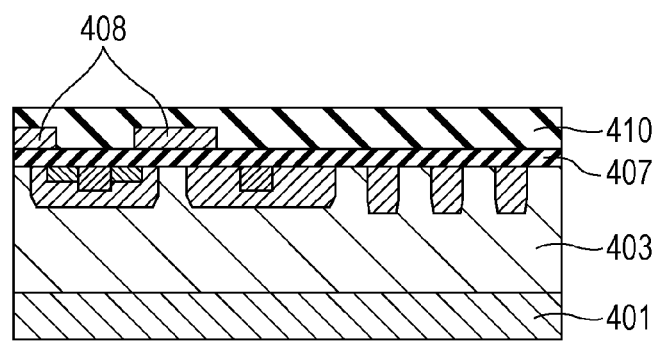

As shown in FIG. 8B, a mask (not shown in the drawing) is used, the polycrystalline silicon film is etched by dry etching and, thereby, the gate electrodes 408 are formed in predetermined regions. As shown in FIG. 8C, the interlayer insulating film 410, which is made from, for example, SiO$_2$, and which is a first insulating film, is deposited by a CVD method in such a way as to cover the surfaces of the gate electrodes 408 and the surface of the drift layer 403. The thickness of the interlayer insulating film 410 is, for example, 1 μm.

Figure 8D:
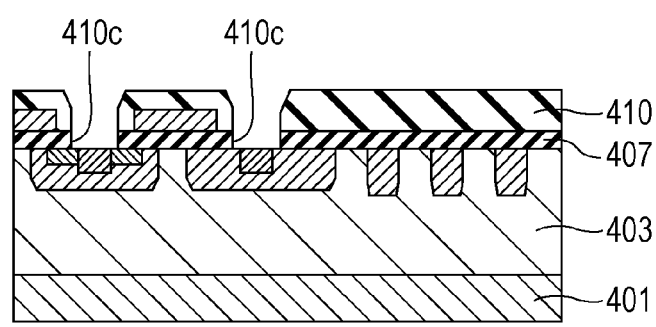

As shown in FIG. 8D, contact holes 410c are formed by using a mask (not shown in the drawing) made from a photoresist and removing the interlayer insulating film 410 and the gate insulating film 407 on the surface of the contact regions 421 and part of the surface of the source region 404 by dry etching.

Figure 9A:
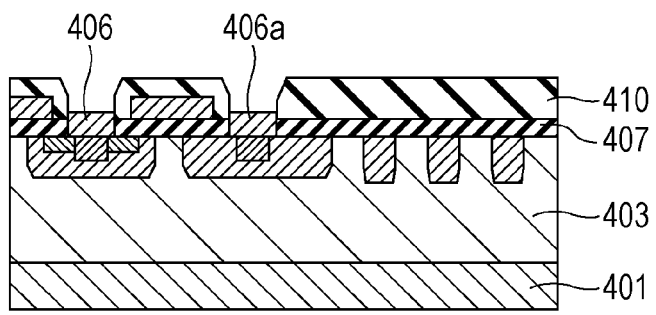
FIGS. 9A to 9C are sectional views showing production steps of the semiconductor device in the second embodiment of the semiconductor device according to the present disclosure.

A Ni film having a thickness of, for example, about 100 nm is formed on the interlayer insulating film 410 having contact holes 410c, and a heat treatment for 1 minute in an inert atmosphere at a temperature of, for example, 950° C. is performed to react the Ni film with the drift layer 403, so that the source electrode made from Ni silicide is formed. The Ni film on the interlayer insulating film 410 is removed by etching, so that the source electrode 406 and a first electrode 406a, as shown in FIG. 9A, are obtained.

Figure 9B:
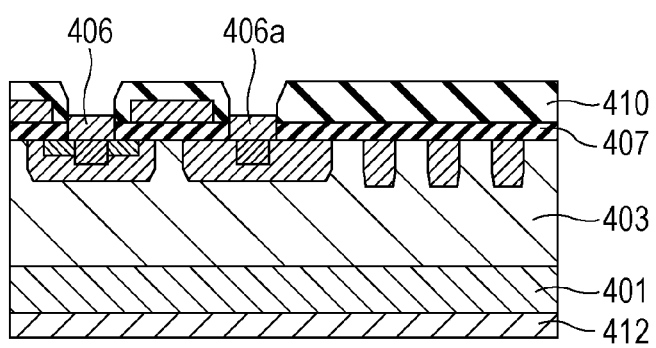

Subsequently, for example, Ni is also deposited on the entire back of the silicon carbide substrate 401 and is reacted with the back of the silicon carbide substrate 401 in the same manner, so that the drain electrode 412 made from Ni silicide is formed as shown in FIG. 9B.

After a mask (not shown in the drawing) made from a photoresist is formed, etching is performed to form opening in parts of the interlayer insulating film 410 on the gate electrodes 408, so that part of the surface of each gate electrode 408 is exposed.

Figure 9C:
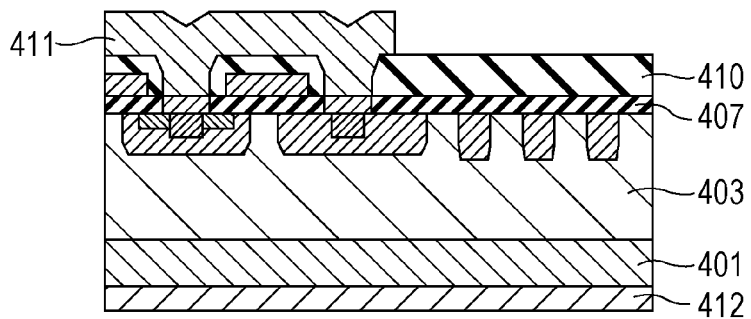
Figure 10A:
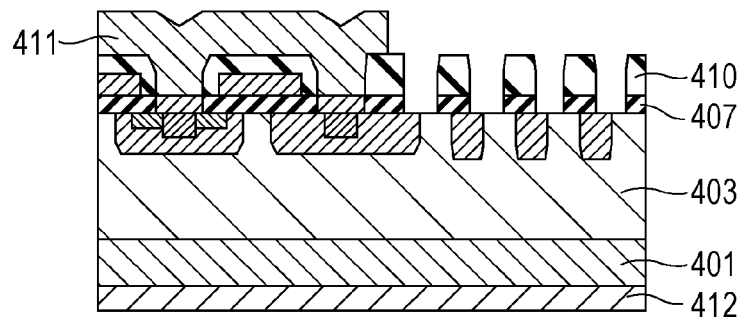
FIGS. 10A and 10B are sectional views showing production steps of the semiconductor device in the second embodiment of the semiconductor device according to the present disclosure.
Figure 10B:
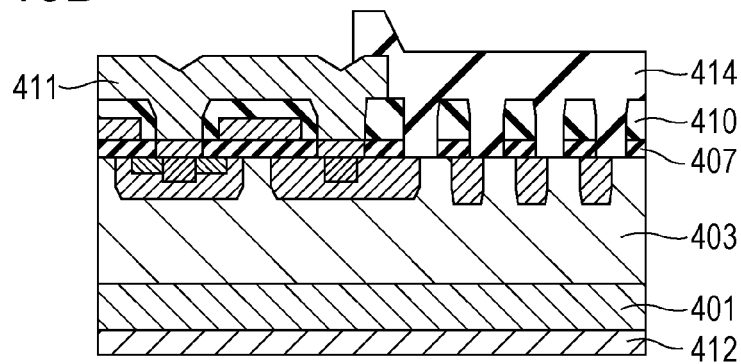

An aluminum film having a thickness of about 4 μm is deposited on the interlayer insulating film 410 and the source electrode 406, the first electrode 406a, and the gate electrodes 408 in the openings formed in the interlayer insulating film 410, and etching into a predetermined pattern is performed, so that the upper electrode 411 is obtained as shown in FIG. 9C. At this time, gate pads separated from the upper electrode 411 and electrically connected to the gate electrodes 408 are formed simultaneously (not shown in the drawing).

After a mask (not shown in the drawing) made from a photoresist is formed on the upper electrode 411 and the interlayer insulating film 410, the interlayer insulating film 410 and the gate insulating film 407 are partly removed by, for example, dry etching and, thereby, boundaries between the drift layer 403 and the outer perimeter side of each of the ring-shaped regions 420d and 420f are exposed.

After a passivation film 414 serving as a second insulating film is deposited on the entire surface of the upper electrode 411 and the interlayer insulating film 410 having the openings, at least part of the passivation film 414 on the upper electrode 411 is removed to expose part of the upper electrode 411.

As necessary, a back electrode for die bonding, for example, Ti/Ni/Ag is deposited on the back of the drain electrode 412. The thicknesses of Ti, Ni, and Ag are, for example, 0.1 μm, 0.3 μm, and 0.7 μm, respectively.

In this manner, the semiconductor device 400 shown in FIGS. 6A and 6B is obtained.

In the above-described embodiments, examples in which MISFET serving as a semiconductor element is disposed in the semiconductor element region have been shown, although not limited to them. Other transistors or diodes may be used as the semiconductor element. Examples of other transistors and diodes include a horizontal metal-insulator-semiconductor field effect transistor (MISFET), a junction field effect transistor (JFET), an insulated gate bipolar transistor (IGBT), a pn junction diode, and a Schottky junction diode.

Figure 11:
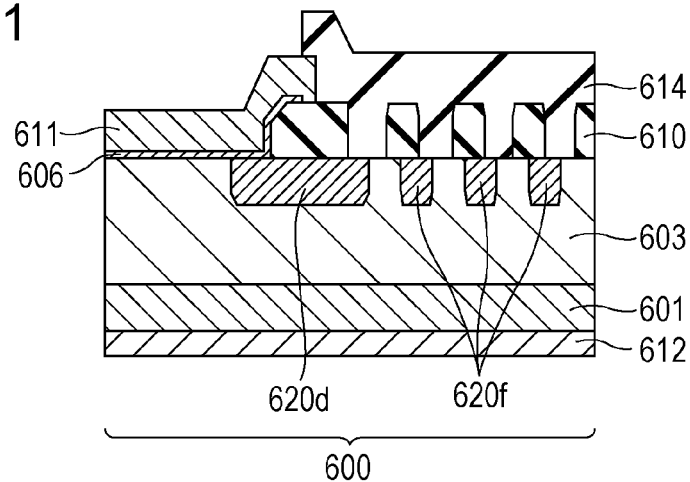
FIG. 11 is a sectional view showing a modified example of the semiconductor device according to the present disclosure.
Figure 12:
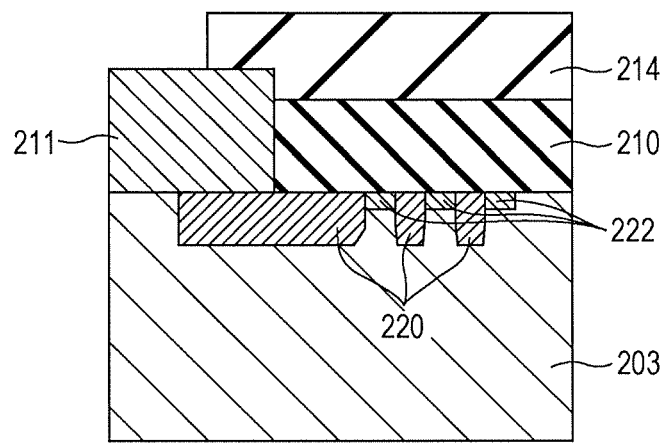
FIG. 12 is a sectional view showing a semiconductor device in the related art disclosed in Japanese Unexamined Patent Application Publication No. 2013-62518.
Figure 13:
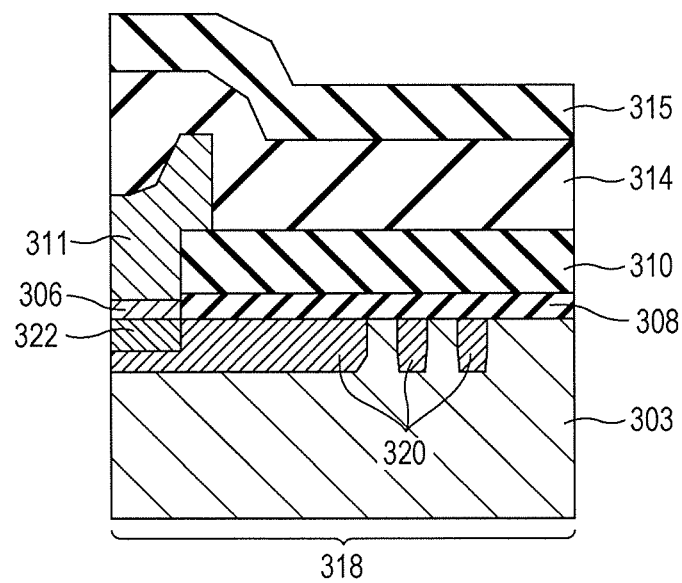
FIG. 13 is a sectional view showing a semiconductor device in the related art disclosed in Japanese Patent No. 4796665.

FIG. 11 shows one example of the Schottky junction diode. A semiconductor device 600 shown in FIG. 11 is provided with a first conductivity type silicon carbide substrate 601 and a first conductivity type drift layer 603. A plurality of second conductivity type ring-shaped regions 620d and 620f are arranged in the drift layer 603 in a termination region. Among them, the ring-shaped region 620d functions as a guard ring region. A plurality of ring-shaped regions 620f are arranged in a peripheral region outside the ring-shaped region 620d.

A Schottky electrode 606 made from, for example, Ti is disposed on the drift layer 603 in the semiconductor element region. The outer perimeter of the Schottky electrode 606 is in contact with the ring-shaped region 620d. An upper electrode 611 is disposed on the Schottky electrode 606. The upper electrode 611 corresponds to an anode of the diode. An ohmic electrode 612 is disposed on the back of the silicon carbide substrate 601. The ohmic electrode 612 is formed by heat-treating, for example, Ni and corresponds to a cathode of the diode. A first insulating film 610 made from, for example, $SiO_2$ is disposed on the surface of the drift layer 603. The first insulating film 610 has openings to the boundaries between the drift layer 603 and the outer perimeter sides of the ring-shaped regions 620d and 620f. A passivation film 614 is arranged on the first insulating film 610 in such a way as to embed the openings. The passivation film 614 is made from, for example, silicon nitride.

In the semiconductor device including the diode as a semiconductor element in the semiconductor element region, electric field concentration may occur on part of the guard ring region and part of a ring-shaped region constituting the FLR structure by applying a high negative voltage to the anode relative to the cathode. On the other hand, in the semiconductor device 600 shown in FIG. 11, in the termination region, the passivation film 614 having a relative dielectric constant higher than the relative dielectric constant of the first insulating film 610 is in contact with the boundaries between the drift layer 603 and the outer perimeter sides of the ring-shaped regions 620d and 620f and, thereby, the electric field concentration can be relaxed. Therefore, a semiconductor device exhibiting a higher withstand voltage can be provided.

The semiconductor device according to the present disclosure is suitable for application to various semiconductor devices. The semiconductor device according to the present disclosure is suitable for application to, for example, power semiconductor devices to be mounted on power converters for mounting on vehicles, industrial equipment, and the like.

What is claimed is:

1. A semiconductor device comprising:
   a semiconductor substrate including a principal surface;
   a silicon carbide semiconductor layer of a first conductivity type that is located on the principal surface of the semiconductor substrate;
   a plurality of ring-shaped regions of a second conductivity type that are arranged in the silicon carbide semiconductor layer and are separated by one or more ring-shaped regions of the silicon carbide semiconductor layer of the first conductivity type;
   a first insulating film; and
   a second insulating film which has a relative dielectric constant larger than a relative dielectric constant of the first insulating film, wherein:
   a region in which a first part of the semiconductor substrate and a first part of the silicon carbide semiconductor layer are located is defined as a semiconductor element region,
   a region in which a second part of the semiconductor substrate and a second part of the silicon carbide semiconductor layer are located, and by which the semiconductor element region is surrounded when viewed from a direction perpendicular to the principal surface of the semiconductor substrate is defined as a termination region,
   the plurality of ring-shaped regions of the second conductivity type and the one or more ring-shaped regions of the first conductivity type are located in the termination region,
   a bottommost surface of the first insulating film is in direct contact with a top surface of the second part of the silicon carbide semiconductor layer in the termination region, and is in direct contact with a top surface of at least a part of each of the plurality of ring-shaped regions of the second conductivity type and a top surface of at least a part of each of the one or more ring-shaped regions of the first conductivity type in the termination region, the second insulating film is disposed on the first insulating film and in direct contact with a top surface and a side surface of the first insulating film, and the second insulating film is in direct contact with a top surface of a part of at least one of the plurality of ring-shaped regions of the second conductivity type and a top surface of at least one of the one or more ring-shaped regions of the first conductivity type in the termination region.

2. The semiconductor device according to claim 1, wherein the second insulating film includes a portion located on the first insulating film and another portion in direct contact with the silicon carbide semiconductor layer in the termination region.

3. The semiconductor device according to claim 1, wherein:

the second insulating film is in direct contact with a part of the at least one of the plurality of ring-shaped regions arranged nearest to the semiconductor element region among the plurality of ring-shaped regions.

4. The semiconductor device according to claim 1, wherein a first boundary and a second boundary are formed between the at least one of the plurality of ring-shaped regions and the silicon carbide semiconductor layer in a cross-section perpendicular to the principal surface of the semiconductor substrate, and the second insulating film is in contact with the second boundary, which is farther from the semiconductor element region than the first boundary.

5. The semiconductor device according to claim 1, wherein:

each of the plurality of ring-shaped regions forms a first boundary and a second boundary between a given one of the plurality of ring-shaped regions and the silicon carbide semiconductor layer in a cross-section perpendicular to the principal surface of the semiconductor substrate, and the second insulating film is in contact with the second boundary of each of the plurality of ring-shaped regions, which is farther from the semiconductor element region than the first boundary.

6. The semiconductor device according to claim 1, wherein the second insulating film is formed from an insulating material containing silicon nitride.

7. The semiconductor device according to claim 1, wherein the first insulating film is formed from an insulating material containing silicon oxide.

8. The semiconductor device according to claim 1, wherein:

the plurality of ring-shaped regions constitutes a field limited ring structure.

9. The semiconductor device according to claim 1, further comprising a diode located in the semiconductor element region.

10. The semiconductor device according to claim 1, further comprising a field-effect transistor located in the semiconductor element region.

11. The semiconductor device according to claim 1, wherein the plurality of ring-shaped regions surround the semiconductor element region when viewed from the direction perpendicular to the principal surface of the semiconductor substrate.

12. The semiconductor device according to claim 1, wherein the semiconductor substrate is 4H—SiC.

13. The semiconductor device according to claim 1, wherein the first insulating film includes a plurality of rings.

14. The semiconductor device according to claim 1, wherein the second insulating film has a ring shape.

* * * * *